United States Patent [19]

Smith

[11] 4,201,303
[45] May 6, 1980

[54] CHASSIS FOR PRINTED CIRCUIT BOARDS

[76] Inventor: Jesse C. Smith, 12 Marian St., Waltham, Mass. 02154

[21] Appl. No.: 948,300

[22] Filed: Oct. 3, 1978

[51] Int. Cl.² ............................................. H05K 7/18
[52] U.S. Cl. ...................................... 211/41; 361/415
[58] Field of Search ................. 211/41, 182; 361/399, 361/412, 413, 415

[56] References Cited

U.S. PATENT DOCUMENTS

| | | | |
|---|---|---|---|
| 3,271,626 | 9/1966 | Howrilka | 361/415 |
| 3,691,430 | 9/1972 | Freitag | 361/415 |
| 3,716,760 | 2/1973 | Bertellotti | 211/41 |
| 3,814,990 | 6/1974 | Warman | 317/122 |
| 3,838,777 | 10/1974 | Thornicroft | 361/415 |
| 3,878,438 | 4/1975 | Weisman | 361/415 |

*Primary Examiner*—Gerald P. Tolin
*Attorney, Agent, or Firm*—C. Hercus Just

[57] ABSTRACT

A chassis for printed circuit (P.C.) boards composed of a pair of parallel end plates having perforation patterns in the corners to receive pronged keys fitting into the ends of multiple channelled rails which extend between the end plates in parallelism with each other and are provided with spaced pairs of notches in rows respectively serving as receiving guides for the P.C. boards and positioning means for the ends of grooved card guides which extend between pairs of said rails and disposed respectively in parallel planes common with opposite edges of said end plates. Self-tapping screws extend through certain perforations in said patterns thereof and also through a hole in each key for threaded engagement with the end of a certain channel of each of said rails to maintain said rails against turning and thereby align opposite guide and positioning notches accurately with each other. A simple manually operable tool is detachably connected to the chassis for convenient use to extract and insert P.C. boards. Connecting nuts or heads of bolts are slidably positioned in certain channels of said rails to prevent turning and to secure covers and/or mother boards or the like to said chassis, and a slidable locking plate secures the P.C. boards against undesired removal from the chassis.

20 Claims, 12 Drawing Figures

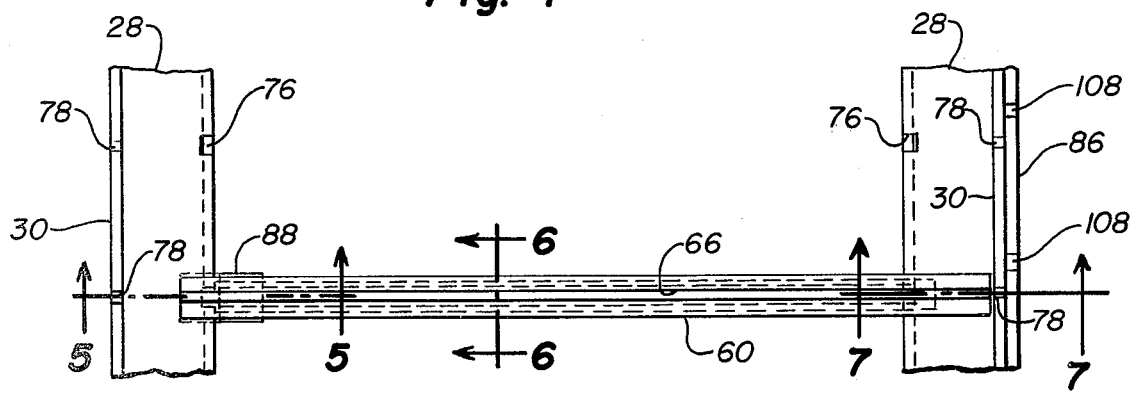
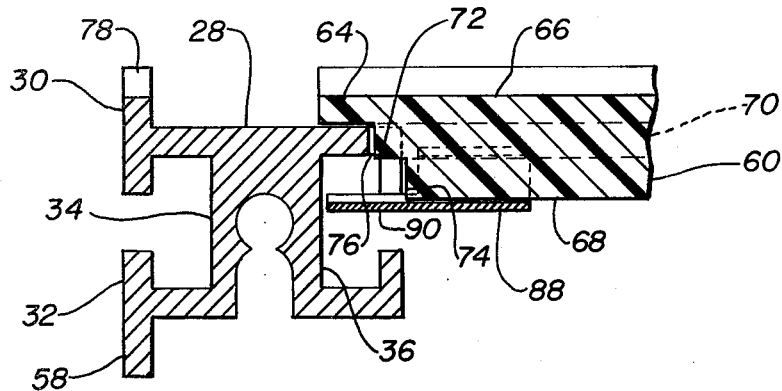
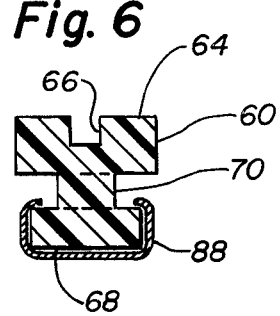
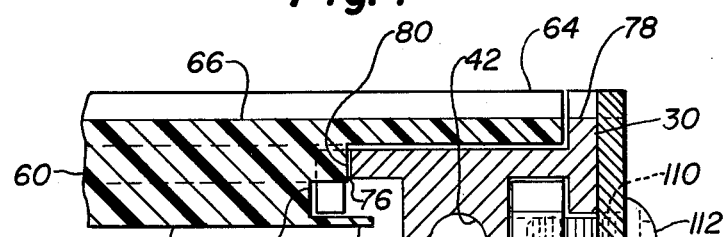
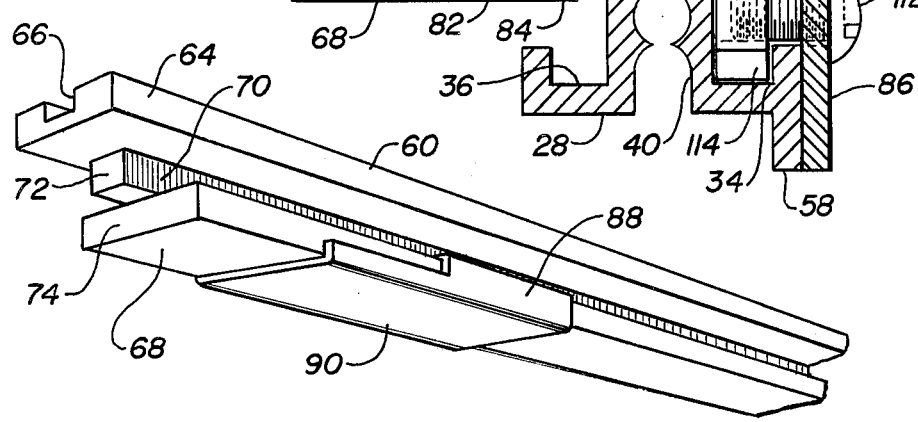

CHASSIS FOR PRINTED CIRCUIT BOARDS

BACKGROUND OF THE INVENTION

Since the inception of printed circuit boards in recent years, it has been necessary to provide supporting means therefor. Such supports preferably have means to permit removal and insertion of the printed boards because, among other reasons, when a circuit board fails, it may be quickly exchanged for a new or replacement board.

As electronic circuits have increased in complexity, the use of great numbers of circuit boards have been required and preferably are arranged in compact relationship to minimize space. This has lead to the development of various types of chassis to support said compact arrangements of circuit boards. Many of such chassis are sophisticated and are composed of parts requiring special dies to form not only end plates and rails or similar elements extending between said plates, but especially in the formation of grooved guide members which are used in opposite pairs respectively to slidably receive the opposite edges of the printed circuit boards which sometimes are referred to as cards.

Various types of chassis developed heretofore which require complex dies to form the same or which are time-consuming to assemble, and therefore, are expensive, are illustrated in the following exemplary U.S. Pat. Nos.: 3,640,399, Hartman, Feb. 8, 1972; 3,814,990, Warman et al, June 4, 1974; 4,013,928, Sarinopoulos et al, Mar. 22, 1977.

Additional prior United States patents pertaining particularly to types of grooved card guide members and means to support the same in the chassis are as follows U.S. Pat. Nos.: 3,016,148, Riddle, Jan. 9, 1962; 3,549,950, Shelden, Dec. 22, 1970.

Various means have also been developed heretofore to aid in the insertion of circuit boards into a chassis and removal of the same therefrom and the following U.S. Pat. Nos. illustrate exemplary devices and arrangements to effect the same: 2,976,510, Blain, Mar. 21, 1961; 3,476,258, Dorsett, Nov. 4, 1969.

SUMMARY OF THE INVENTION

It is the principle objective of the present invention to provide a simple chassis for printed circuit boards or cards which primarily is formed from material which is formed into components by apparatus which punches, bends or shears the material to form the components in mass type production, with another main objective of the components being capable of assembly with a minimum of connecting elements and least use of manual labor and consumption of time, while maintaining precision in details which renders the use of the completed chassis extremely accurate, simple and effective. These objectives are achieved by the following means, details and procedures.

A pair of similar end plates are blanked from sheet metal to precise dimensions and have parts of connecting means, such as punched patterns of perforations which require no drilling or other formation operations. Similar rails, principally rectangular in cross-section, are cut to precise lengths from extruded rail stock having a pair of similar channels which are T-shaped in cross-section and having the ends of the stems of the tees extending through opposite sides of said rails, and another channel extending inward from another side which extends between said opposite sides has an inner end which is substantially cylindrical in cross-section, and a larger diameter than the width of the outer end of said channel, to receive self-tapping screws in the opposite ends of said channels, said screws extending through one of the perforations of said patterns thereof in said end plates.

Keys having at least one prong thereon and a screw-receiving hole therein are used to connect each corner of said end plates to opposite ends of said rails solely by threading said screws into the ends of said rails after inserting the prong of said key through a perforation of each pattern thereof to prevent rotation of said rails about the axes thereof.

Groove guide members for said printed circuit boards are formed from stock lengths of preferably extruded plastic material which is substantially H-shaped in cross-section, one side thereof being grooved to slidably receive one edge of a circuit board when mounted in said chassis, positioning means being formed on the opposite ends of precise lengths of said stock formed by punch means incident to forming said guide members to required length from supply lengths of stock to extend between opposite rails adjacent the front and rear faces of said chassis.

Circuit board inserting and removal means are also provided to facilitate inserting said boards into the chassis and removing the same therefrom, as well as releasable locking means to prevent removal of the boards from the chassis also being provided. The T-shaped channels of said rails also receive nuts or heads of bolts of geometrical shape positioned in said channels to prevent rotation but permit slidable movement to accommodate the same to openings in a cover or mother board for attachment of the same across the front and rear faces of the chassis.

Details of the foregoing objects and of the invention, as well as other objects thereof, are set forth in the following specification and illustrated in the accompanying drawings comprising a part thereof.

BRIEF DESCRIPTION OF THE DRAWINGS

FIG. 4 is a fragmentary plan view of a portion of the lower part of the chassis as seen generally on the line 4—4 of FIG. 3 and illustrating only a single card guide in said view.

FIG. 5 is an enlarged fragmentary vertical sectional view of a portion of the apparatus shown in FIG. 4, as seen on the line 5—5 thereof, and particularly illustrating the connecting means for one end of the card guide relative to the channeled rail which supports the same.

FIG. 6 is a transverse sectional view of the card guide shown in FIG. 4, as seen on the line 6—6 thereof, and being on the same scale as in FIG. 5.

FIG. 7 is a fragmentary vertical sectional view of the opposite end of the card guide shown in FIG. 4, and illustrating the attaching means by which it is supported by the opposite channeled rail from that shown in FIG. 5.

FIG. 8 is a fragmentary perspective view showing the end of the card guide per se, illustrated in FIG. 5, and showing in detail the positioning means received by a notch in the channeled rail which supports the same.

DETAILED DESCRIPTION

Figure 1:
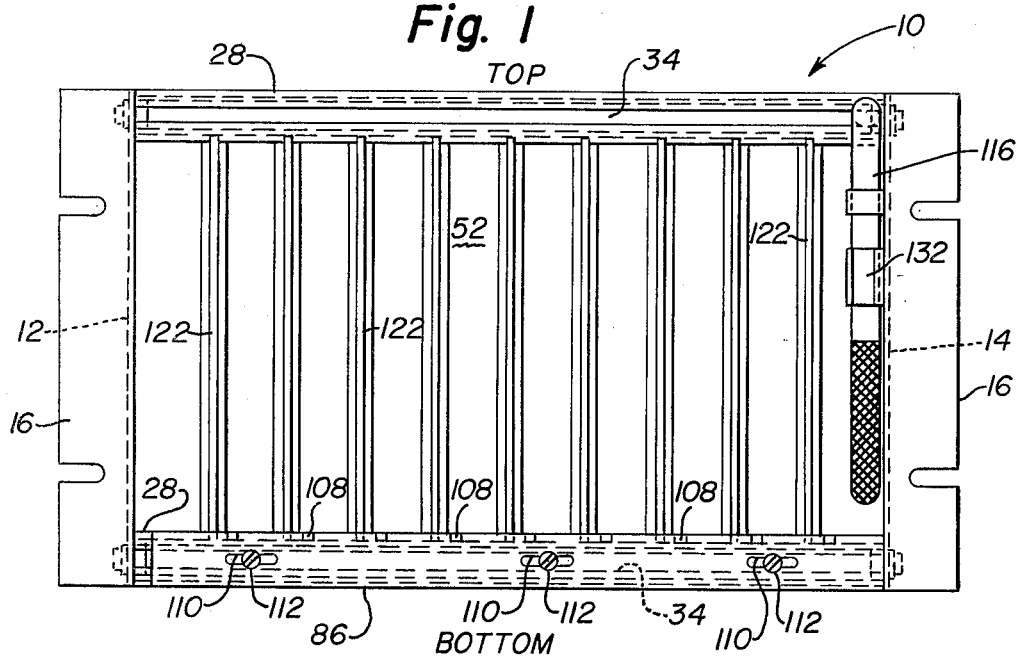
FIG. 1 is a front elevation of a chassis for slidably supporting printed circuit boards, including the principles of the present invention, said view omitting a front cover for the chassis.

As indicated above, there are a number of primary objectives of the present invention which include, in particular, the minimizing of cost of manufacturing the individual components of a chassis for holding printed circuit boards, hereinafter referred to as P.C. boards, and in particular, the minimizing of cost in assembling the components of such chassis, the details of said components and method of assembly being such that unskilled labor can be employed to effect the fabrication and assembly of the chassis and, in addition to minimizing the cost, certain advantages are included in the chassis which are not present in the prior art. The details of the components and method of assembly are set forth in detail hereinafter and are illustrated in the drawings described above, and in which the simplification of previously employed components for a chassis to hold P.C. boards are shown in said drawings, but in regard to which the simplification includes innovations not found in, nor suggested by the prior art.

Figure 2:
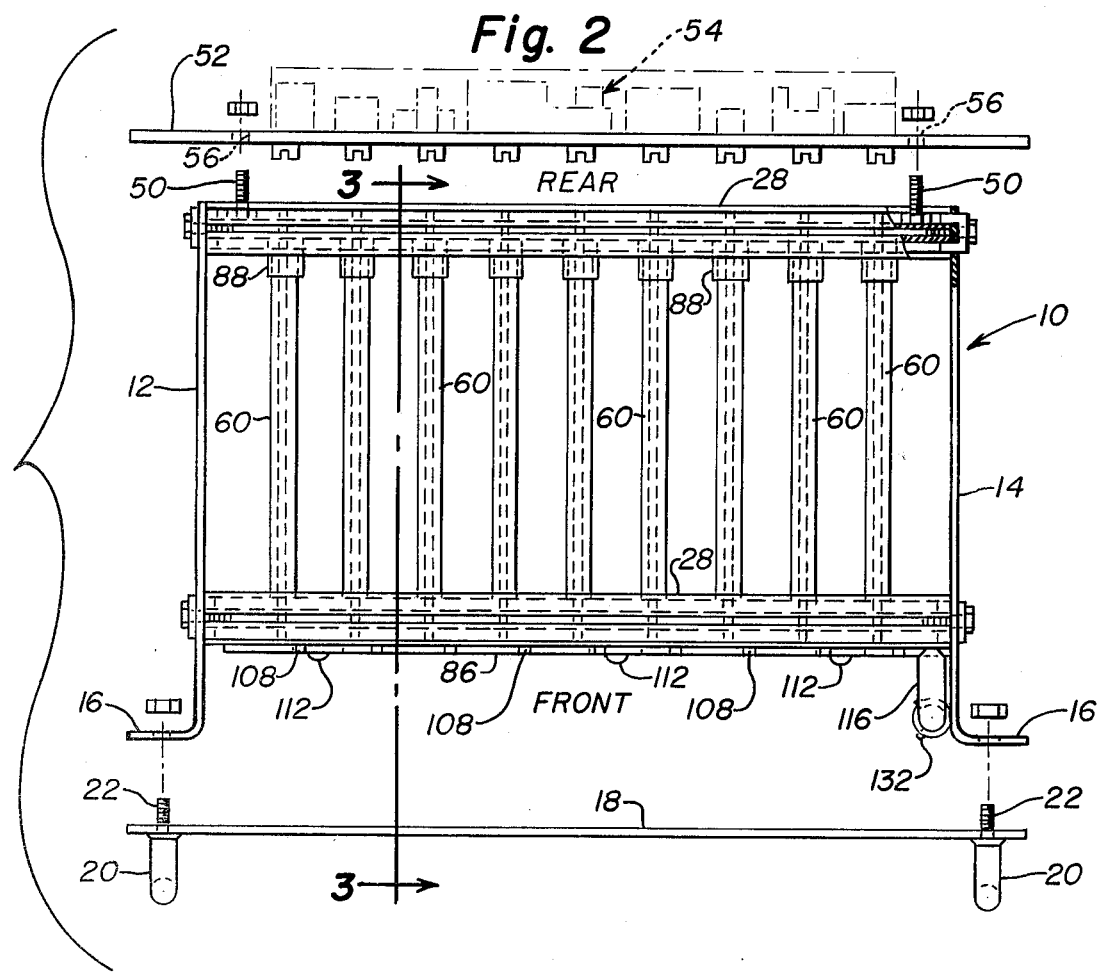
FIG. 2 is an exploded top plan view of the chassis shown in FIG. 1 and additionally illustrating a front cover for the same.
Figure 3:
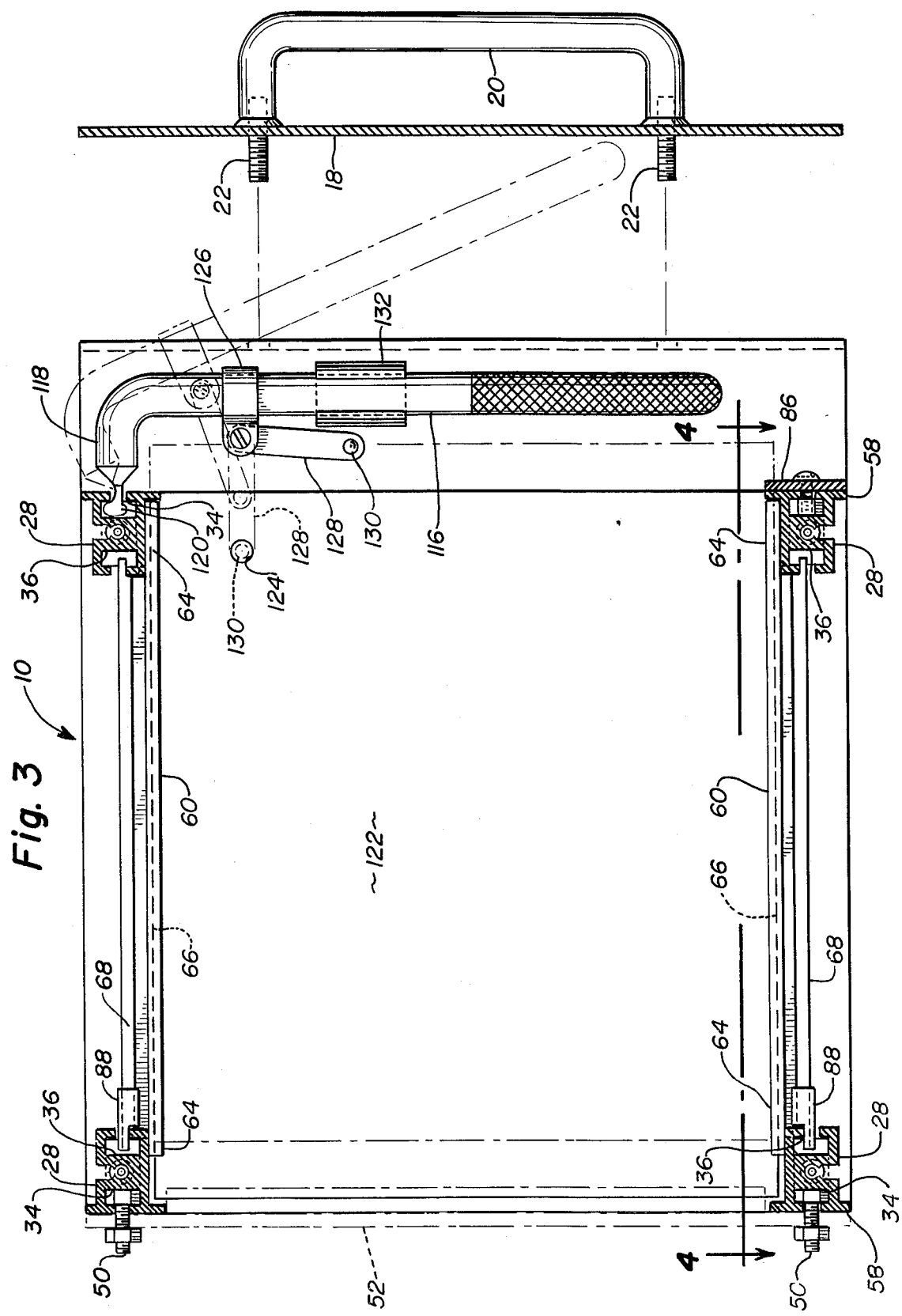
FIG. 3 is a vertical sectional view, as seen on the line 3—3 of FIG. 2, but illustrating the chassis and its components on a larger scale than in FIG. 2, and said view also showing the front cover in exploded manner and, in addition, showing a tool for inserting and removing the printed circuit boards from the chassis, said tool being shown in full lines in stored position and, in phantom, being illustrated in one position of operation.

Referring to FIGS. 1 and 2, the chassis 10 is very simple and includes only the necessary rudiments required to effectively and operatively support a plurality of P.C. boards. These components include end plates 12 and 14 which are blanked from sheet metal stock, such as aluminum of suitable gauge. Lateral flanges 16 are formed on one forward edge of the end plates 12 and 14, primarily for purposes of receiving and supporting a front cover 18, which may be formed of any suitable material and stamped or sheared from sheet stock, said cover preferably being provided with handles 20 adjacent opposite ends thereof, said handles preferably being of the bail type as shown in FIG. 3, and the ends of the legs thereof having threaded lugs 22 thereon for engagement by nuts, not shown, to secure the front cover connected to the chassis.

Figure 12:
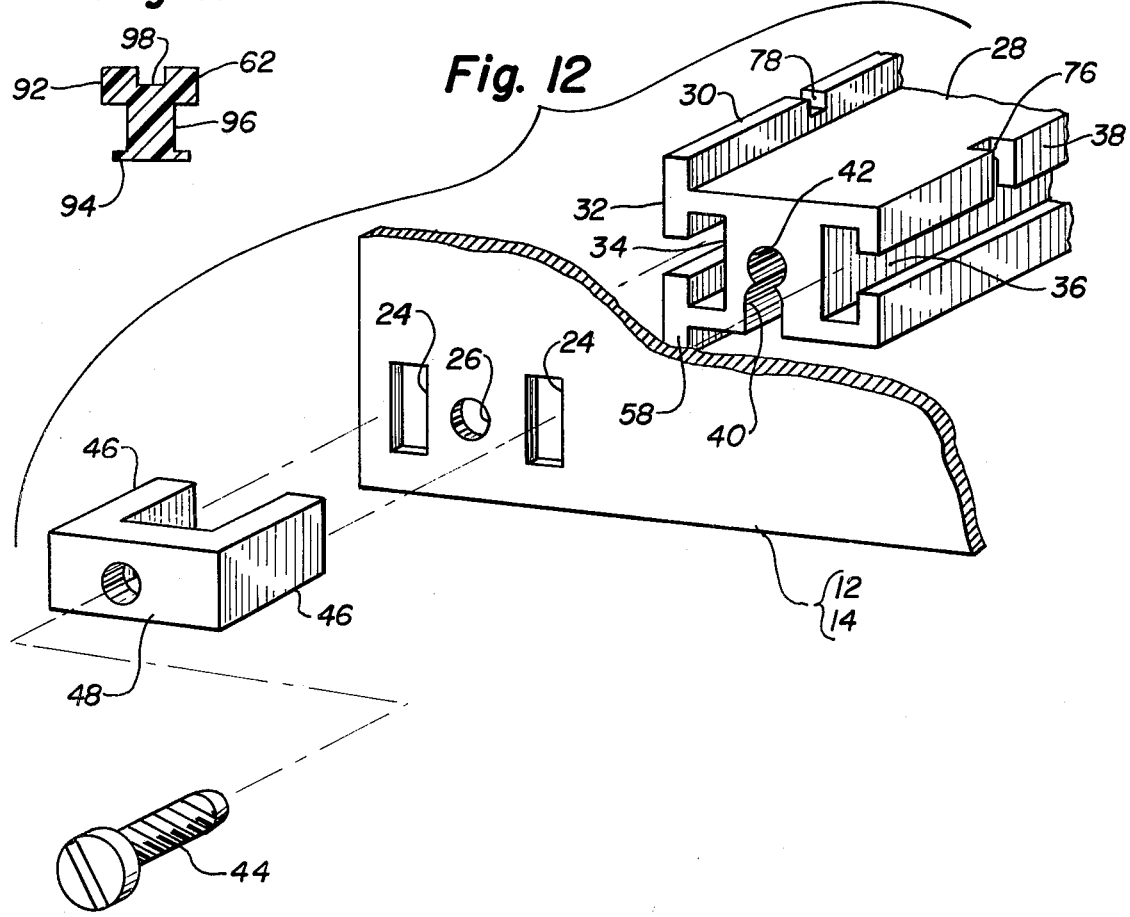
FIG. 12 is an exploded, enlarged fragmentary view, showing the means by which the end plates are connected to the opposite ends of the channeled rail, including a key and self-tapping screw by which the rails are rendered non-rotatable about their axes when connected to the end plates.

The end plates preferably are rectilinear in shape and each corner thereof is formed with patterns of perforations which include a pair of similar rectangular openings 24 and a circular hole 26, which are best shown in detail in FIG. 12. Such pattern of perforations readily and inexpensively may be formed by punching operations and all the patterns in each end plate may be formed simultaneously by suitable punching equipment, thereby minimizing expense of production. The purpose of such perforation pattern is to secure one end of a plurality of similar channeled rails 28 to each corner of the end plates 12 and 14. Said channeled rails preferably are extruded members and are formed from appropriate material, such as aluminum, in various stock production lengths and similar rails of desired length are formed by sawing or otherwise severing said lengths from the stock lengths of material, thus constituting another saving in production costs.

Referring to FIG. 12, it will be seen that the channeled rails 28 are substantially rectangular in cross-section and have a flange 30 extending upward from one corner thereof for purposes to be described, said flange being coincident with the face 32, which normally is outermost when pairs of said rails are mounted in vertically disposed relationship adjacent the front face of the chassis and, correspondingly, a similar pair are mounted in vertically spaced relationship adjacent the rear face of the chassis, these faces being indicated by legends in FIG. 2.

The rails 28 are provided respectively in the outer and inner faces thereof with similar T-shaped channels 34 and 36, which serve a plurality of purposes described hereinafter. The transverse face of the rails 28, which is between the outer face 32 and the inner face 38 is also provided with an additional channel 40 which has an intermediate constriction that terminates inwardly in a substantially circular configuration 42 for purposes of receiving a self-tapping screw 44, shown in FIG. 12.

Among the purposes of the T-shaped channels 34 and 36 is the reception of a pair of legs 46 of a key 48, which is U-shaped, the cross-sectional dimensions of the legs 46 being complementary to the rectangular openings 24 in the corners of the end plates 12 and 14 and through which said legs extend for slidable reception within the ends of the T-shaped channels 34 and 36. The key 48 is provided with a circular hole in the bight portion thereof for reception of the self-tapping screw 44 which also extends through the circular hole 26 in the perforation pattern in the corners of the end plates thereafter being threaded into the end of the circular configuration 42 in the rail 28.

From the foregoing, it will be seen that in order to effect the assembly of the opposite ends of the rails 28 with the end plates 12 and 14, it is only necessary to insert the keys 48 through the rectangular openings 24 of the perforation patterns in the corners of the end plates, into the end of the T-shaped channels 34 and 36 in the rails 28 with which they are closely complementary and, upon threading the screw 44 into the circular configuration of the additional channel 40 at each corner of the chassis, which can readily be effected by powered screwdrivers, for example, whereby the end plates 12 and 14 are drawn into tight-fitting relationship with the ends of the rails 28, and in view of the reception of the legs 46 of the keys 48 within the openings 24 in the end plates and the ends of the T-shaped channels 34 and 36, it is impossible for the rails 28 to rotate about their axes. Accordingly, this constitutes one function of the T-shaped channels 34 and 36.

A second function of the channel 34 of the rails 28 which is within the outer face 32 thereof, is to receive either a configurated nut or a configurated head of a bolt which are slidable but non-rotatable within the channel 34, whereby, as shown best in FIG. 3, exemplary bolts 50 which project from the rear face of the chassis, which is adjacent the left-hand end of FIG. 3, are capable of extending through appropriate holes in a "mother" board 52, which is shown in phantom in FIG. 3, and also in full lines in FIG. 2. It is only necessary that the holes in the "mother" board be of uniform vertical spacing, corresponding to the vertical dimension between the channels 34 in the rails 28 adjacent the rear face of the chassis. In FIG. 2, the "mother" board 52 is illustrated in phantom on its outer face with exemplary components 54, rather than illustrating any particular detailed illustration of such components. Due to the slidability of the heads of the bolts 50 in the channels 34, the holes 56 in the "mother" board, shown in FIG. 2, may be at any desired longitudinal position along the upper and lower edges of the "mother" board 52.

The rails 28 also are provided with an additional flange 58 which is similar to, but extends oppositely from the flanges 30 within the face 32 of the rails 28, particularly in the lower pair of rails 28, said flanges serve as a base flange upon which the chassis may rest when removed from any cabinet or other similar arrangement in which the chassis is mounted when in operation.

Another primary objective of the present invention is in relation to the card guides which are directly engaged, for example, by the normally upper and lower edges of the P.C. board. Much effort has been devoted to the formation of card guides in the prior art and many of them are highly sophisticated and are relatively expensive to manufacture. In an effort to minimize such expense, as well as provide an improved card guide, the present invention includes two different embodiments which are respectively illustrated in FIGS. 1–8 and in FIGS. 9–11. Embodiments shown in FIGS. 1–8, the card guides 60 may be of substantially rigid nature, whereas in embodiment of FIGS. 9–11, the card guides 62 have limited flexibility and different positioning means at the opposite ends thereof from the positioning means on the opposite ends of the guides 60 in the first-mentioned embodiment.

It is preferred, however in both embodiments of card guides that the same be formed from indefinite stock lengths of extruded or molded plastic material, and one which is strong and preferably self-extinguishing with respect to fire, as well as having a minimum coefficient of friction, whereby the opposite edges of P.C. boards readily may be slidably inserted within and removed from the receiving groove in the card guides. One highly satisfactory synthetic resin or plastic which has been employed in the development of this invention is sold under the trade name "NOREL" and is manufactured by the General Electric Co., Pittsfield, Mass.

One advantage of utilizing a suitable synthetic resin or plastic for the card guides is that stock lengths of extruded material may be formed into desired lengths to extend between front and rear pairs of supporting rails and, incident to forming desired lengths thereof, the positioning means respectively at the opposite ends of the guide may be formed, such as by inserting the stock material in a suitable punch or jig and, with a single stroke of the punching element, the desired configuration of one end of the card guide is formed and simultaneously, the configuration of the opposite end of the next card guide is formed, thereby additionally minimizing expense of construction, as well as provide simple but fool-proof attaching means on the opposite ends of the card guide which coengage complementary notches in the rails 28 which will now be described in detail.

The card guides 60 are illustrated in cross-section in FIG. 6. In this figure, it will be seen that the guide is substantially H-shaped in cross-section and in which the side 64 is formed with a guide channel or groove 66 which slidably receives one edge of a P.C. board. The opposite side 68 is less wide than the side 64 and an intermediate web 70 of less width than either of the sides 64 or 68 extends between and connects the sides 64 and 68. The web 70 performs a highly important function which may be observed from FIG. 5 in which one end of the relatively rigid embodiment of card guide 60 is shown. This end may be regarded as the locking end and it will be seen that the outer end of side 64 extends farthest of any of the other portions, while the end 72 of the web 70 is spaced inward from the projecting end of side 64 and forms a positioning key in view of the fact that it extends beyond the end 74 of side 68 of the guide 60. The positioning key 72 is received within a notch 76 in rail 28 which is shown in FIG. 5, but is illustrated to better advantage in FIG. 12. The notch 76 also is in transverse alignment with an additional notch 78 in flange 30, which is for purposes to be described.

Another cost-saving advantage of the present invention resides in the fact that all of the notches 76 and 78 along all of the rails preferably are evenly spaced longitudinally and may be punched simultaneously by inserting either a cut length of stock which forms each rail, or one end of the rail stock may be inserted in an appropriate punch of a compound nature operable simultaneously or in immediately successive steps to punch all of the notches 78 and/or all of the notches 76, thus effecting accurate placement of all of the positioning notches 76 in the inner faces 38 of the rails 28, but only through the upper portions of the T-shaped channel 36 as viewed in FIG. 12, for example.

Referring to FIG. 7, the opposite end of each of the card guides 60 is shown, and it will be seen that said end differs from the end shown in FIG. 5, but said end, nevertheless, possesses the positioning means of the opposite end. However, it will be seen that the terminal end portion of side 64 of the guide 60 extends over the adjacent surface of the rail 28 and substantially into the immediate vicinity of the flange 30 of rail 28, while the end 80 of the intermediate web 70 extends into the positioning notch 76 of rail 28, but a channel 82 has been formed transversely through the side 68 of guide 60, by means of which a relatively thin projection 84 remains on the end of side 68 so as to be disposed within the T-shaped channel 36 and thus, prevent that end of the guide 60, shown in FIG. 7, from raising upward from the rail 28 as viewed in FIG. 7. Also, it will be seen from FIG. 7 that the end of the guide channel 36 is immediately adjacent the additional notch 78, as also seen in plan view in FIG. 4, for purposes of forming a ready means for guiding the leading end of a P. C. board into alignment with the guide channel 66. However, the notches 78 are blocked as illustrated in FIG. 6 by a slide lock 86, details of which are described hereinafter.

As indicated above, the card guides 60 preferably are relatively rigid. When mounting the same between a pair of the channels 28, regardless of whether at the so-called top or bottom of the chassis, the end of the rail 60 shown in FIG. 7, is first inserted by disposing the positioning end or projection 80 on the end of web 70 within the positioning notch 76 in rail 28 and then disposing the end of the guide 60 shown in FIG. 5, in operative position relative to the rail 28, illustrated therein by lowering the positioning key 72 comprising the end of web 70 into the positioning notch 76 while the slide 86 is retracted as shown in FIG. 8, for example. Then, after the positioning key 72 is disposed in the positioning notch 76, the slide 86 is projected to the position shown in FIG. 5, and thus dispose the locking projection 90 thereon into the channel 36, it being understood that the width of the locking end 90 is greater than the width of the notch 76, whereby the locking end 90 is disposed adjacent the lower end of the notch 76, and thus prevents upward movement of the guide 60 with respect to the rail 28, as viewed in FIG. 5. Removal of the guide 60 is readily effected simply by moving the slide 86 to a retracted position, such as shown in FIG. 8, and then lifting the guide from its position between the rails 28. Slide 86 preferably is formed from suitable metal or any other appropriate material and the opposite sides thereof, as viewed in FIG. 6, extend upward around the side 68 of guide 60 and terminates in inwardly turned ends extending toward the web 70, thus effecting appropriate slidable connection of the slide with the guide 60.

Figure 9:
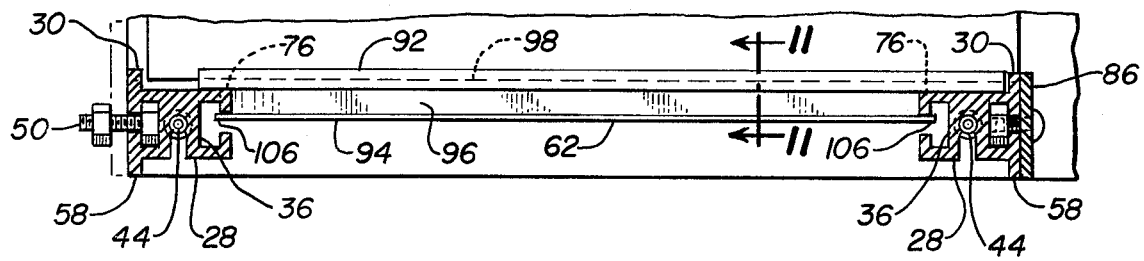
FIG. 9 is a vertical sectional view of the lower portion of the chassis and is similar to the structure shown in FIG. 4, except that the same in shown in side elevation rather than in plan as in FIG. 4, and FIG. 9 also showing another embodiment of card guide from that illustrated in the preceding figures.
Figure 10:
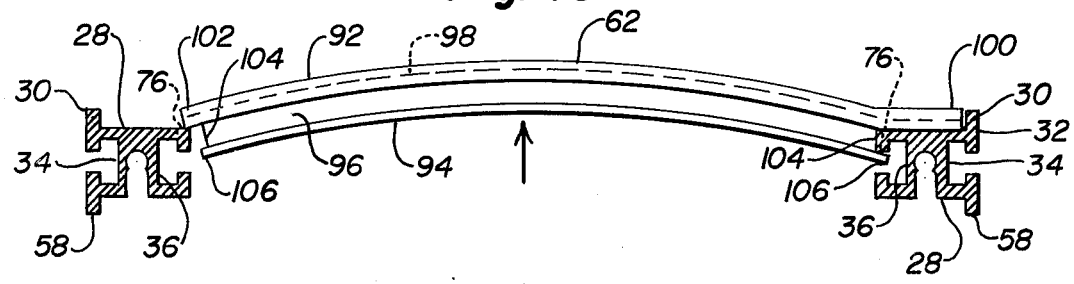
FIG. 10 is a view similar to FIG. 9 and illustrating the card guide in bowed condition incident to operatively positioning the same between the opposed channeled rails which support it.
Figure 11:
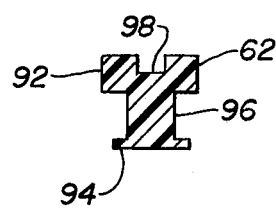
FIG. 11 is an enlarged vertical sectional view of the card guide shown in FIGS. 9 and 10, as seen on the line 11—11 of FIG. 9.

Referring to FIGS. 9–11, in which the additional embodiment of card guide 62 is shown, as indicated above, the guide 62 preferably is formed of synthetic resin or plastic of the general type from which the guides 60 are shown, except that the composition of the plastic is adjusted to produce desired limited flexibility in order that the guide 62 may be flexed somewhat as shown in FIG. 10 from the normally straight position thereof, shown in FIG. 9, in order to effect connection of the opposite ends thereof with the rails 28. Referring to FIG. 11, it also will be seen that the guides 62 are substantially H-shaped in cross-section and include an upper side 92, as viewed in FIG. 11, a lower side 94, as viewed in said figure, and an intermediate web 96, which is narrower than either of the sides 92 and 94. The side 92 also is provided with a guide channel 98 which corresponds to the guide channel 66 in the previously described embodiment of card guide.

The opposite ends of the card guide 62 are different to the extent that the end 100 of side 92 of the guide 62 is longer than the end 102 at the opposite end of the card guide due to the fact that the guide groove in the end 100 must align with the notch 30 in the rib of face 32 as in regard to the end of the guide 60 which is shown in FIG. 7. Also as in regard to the card guide 60, the opposite ends of the card guide 62 are formed by a punching operation in a suitable die or jig but, as can be seen from FIGS. 9 and 10, the opposite ends 104 of web 96 form positioning keys respectively received within the notches 76 in the rails 28 after the same have been disposed opposite said notches when the guide is flexed, as shown in FIG. 10, and then released to permit the ends 104 to be projected into said notches and thus, effectively position the guides at desired locations as determined by the notches 76. In order to prevent the opposite ends from being removed from said notches 76, however, it will be seen that the lower sides 94 of the guides 62 extend outwardly a short distance beyond the opposite ends 104 of web 96 to form projections 106 which extend into the channels 36, and due to the side 94 being wider than the notch 76, it is not possible for the guides 62 to be removed from the desired positions thereof on the rails 28 when the guides 62 are in the straight position shown in FIG. 9.

After a desired complement of P.C. boards or cards have been inserted between the opposed pairs of guide channels or grooves 66 and 98 respectively in the guides 60 and 62, they may be locked in such positions by the use of the aforementioned slide lock 86 which, as shown in FIGS. 1 and 2, is provided with a plurality of notches 108 which are spaced longitudinally similarly to the notches 78 in flange 30, as shown fragmentarily in details in FIG. 4. When the slide is in non-locking position, the notches 108 therein are in alignment with the notches 78 in flange 30 but, as viewed in FIGS. 1, 2 and 4, slide 86 has been moved to dispose the notches 108 out of alignment with the notches 78 and thus, prevent the removal of the P.C. boards from the chassis. The slide lock 86 is provided with a plurality of slots 110, best shown in FIG. 1, through which screws or bolts 112 extend. As shown in FIG. 7, the bolts 112 are threaded into nuts 114 disposed non-rotatably within T-shaped channel 34, and when the bolts 112 are tightened, the slide lock 86 is secured in locked position.

Referring to FIGS. 1 and 2, and particularly to FIG. 3, it will be seen that the present invention also includes a useful tool 116 in the form of a lever which, for example, may be made from bar stock of metal and one end 118 thereof is bent so as to be perpendicular to the principal length of the tool 116 which comprises the handle thereof. The end 118 terminates in a head 120, which is somewhat T-shaped but the dimensions thereof are such that the head readily can be slidably moved along the T-shaped channel 34 and fits somewhat loosely therein so as to permit pivotal movement of at least limited extent to facilitate insertion of the P.C. boards within the chassis and removal of the same therefrom. It will be understood that the terminals at the inner end of the P.C. board engage sockets in the "mother" board with substantial friction and, usually, manually force is inadequate to at least disengage the P.C. boards from the "mother" board without the use of some type of appropriate tool. Heretofore, it has been common practice to attach short lever or latch-type elements directly to each P.C. board for engagement with the adjacent rails to effect such removal and/or final insertion of the boards into the chassis. Obviously, such construction is expensive, and the present invention has been devised to eliminate that expense.

In accordance with the invention, each P.C. board 122, which is shown in full lines in FIG. 3 in fully inserted position, and in phantom, in partially projected position, is provided with a suitable hole 124. Mounted upon the handle portion of the tool 116, adjacent the end 118 thereof, is a clevis 126, which preferably is frictionally slidable upon said handle. One end of a link 128 is pivotally connected to the clevis 126 and the opposite end thereof has a lug 130 projecting from one face thereof which is complementary to the hole 124 in the P.C. board and readily may be disposed therein when the tool is in the full line position shown in FIG. 3 but removed from the storage clip 132. It is only during the initial removal or insertion movements of the P.C. boards with respect to the chassis that assistance of some type of leverage means is required because once the terminals have been removed from the sockets in the "mother" board, the P.C. boards then usually are readily slidable within the upper and lower guides.

It is preferred in accordance with the invention that the tool 116 may be provided with each chassis but, due to the fact that the head 120 thereof is slidable along the T-shaped channel 34, the tool may service any selected P.C. board of all that are mounted within the chassis. After the tool has been used to effect either the final insertion or the initial removal of the P.C. boards, it then may be returned to its storage position in which it is disposed within the storage clip 132 of a simple spring nature. As viewed in FIG. 2, it can be seen that the clip 132 is mounted upon the outermost portion of end plate 14, for example, and the tool 116 is disposed adjacent said end plate when in stored position.

From the foregoing, it will be seen that the present invention provides a simplification of means for forming the components and assembly of the necessary element of a chassis for holding P.C. boards in operative position, locking the same therein after they have been positioned within the chassis, and also providing a tool to assist in the initial removal and insertion operations. Of even greater importance, however, is the provision of means by which the end plates may be connected to the opposite ends of extruded rails by the means of simple keys which may be formed from channel stock sawed into suitable lengths to form U-shaped keys described hereinabove for insertion through punched patterns of perforations in the end plates and then extending into the outer end portions of T-shaped channels in the extruded rails to render the rails non-rotatable about their axes. Positioning, as well as card guide notches, are formed in the rails simultaneously by inexpensive punching operations, and of greatest importance is the fact that the opposite ends of the card guides may be formed also by punching operations which simultaneously form positioning key means in the opposite ends of the guides, as well as separate required lengths thereof from infinite length of stock extrusion, several embodiments of means to prevent removal of the guides from the positioning notches also being provided.

The foregoing description illustrates preferred embodiments of the invention. However, concepts employed may, based upon such description, be employed in other embodiments without departing from the scope of the invention. Accordingly, the following claims are intended to protect the invention broadly, as well as in the specific forms shown herein.

I claim:

1. A chassis for printed circuit boards or cards comprising in combination, a pair of end plates of rectilinear shape having similar perforation patterns adjacent the corners thereof, extruded rails each having a pair of spaced channels therein extending equally between said end plates with the ends of said spaced channels in alignment with certain perforations in said patterns thereof, similar keys respectively adjacent each pattern of perforations and each having a hole therein and at least one prong extending through one perforation of each of said patterns thereof and into the end of one channel in the end of the rail adjacent each pattern of perforations, a self-tapping screw extending through the hole in each key and also through another perforation of each pattern and threaded into the end of another channel in the end of the rail abutting each pattern of perforations to secure said rails against turning about the axes thereof, grooved guide members for said boards extending in opposed parallel pairs between opposite pairs of said rails in spaced relationship along said rails, and positioning means comprising projections respectively on the opposite ends of said guide members and interfitting with notches spaced along said rails to position said guide members at desired fixedly spaced locations along said rails and prevent relative movement between said guide members and rails in any direction.

2. The chassis according to claim 1 in which said keys each have a plurality of prongs respectively closely complementary in cross-section to and respectively extending into the ends of said spaced channels in said rails, said prongs being on the opposite sides of said hole in each key and said perforations in said patterns thereof through which said prongs projects being closely complementary in shape thereto to insure accurate positioning of said rails relative to each other and maximize resistance to shear between the ends of said rails and end plates.

3. The chassis according to claim 1 in which said keys are U-shaped and the legs thereof comprising said prongs, said prongs being rectangular in cross-section, and said hole being formed in the bight of each said key between said prongs, said keys also comprising uniform sections of channel-type stock and the perforations of said patterns thereof through which said legs of said keys project being rectangular in shape and closely complementary in shape to the cross-section of said prongs to precisely position said rails relative to each other.

4. The chassis according to claim 1 in which said patterns of perforations adjacent the corners of said end plates are of precise shape and are formed by being punched therethrough to expedite manufacture and minimize cost and also affording precise dimensions and shape.

5. The chassis according to claim 1 in which said extruded rails have a pair of similar channels in opposite sides which are T-shaped in cross-section and have the heads of the tees innermost and the stem of said tees opening through and extending along said sides, and said keys being U-shaped and each having a pair of parallel prongs of predetermined shape extending therefrom and respectively extending through certain spaced perforations of said patterns thereof in said end plates which are of complementary shape to th cross-section of said prongs and also extending into the ends of said pairs of channels in said rails which have cross-sectional shapes closely complementary to the cross-section of said prongs.

6. The chassis according to claim 5 in which said extruded rails also have another channel extending into another side thereof between said opposite sides, the inner end of said channel in cross-section being at least partially cylindrical to receive said self-tapping screws in opposite ends thereof, the diameter of said inner end of said another channel being less than the outer diameter of the threads of said self-tapping screws to permit said threads to form complementary threads in the ends of said cylindrical inner ends of said channels.

7. The chassis according to claim 5 in which said chassis has front and rear faces respectively adjacent and parallel to opposite edges of said end plates and the ends of the T-shaped channels in one side of each rail respectively opening outward into said faces, whereby a pair of said rails is positioned respectively adjacent opposite edges of each of said faces, of said chassis and securing means for a cover or a mother board extending through said ends of said T-shaped slots disposed in said faces and slidable therealong to adapt the same to complementary holes for securing means in said cover or mother board.

8. The chassis according to claim 7 in which said securing means comprises nuts or bolts having heads of similar geometrical configurations of which opposed faces are complementary to the width of the inner ends of said T-shaped channels to prevent rotation of said securing means relative to said channels but permit sliding of the same along said channels as aforesaid.

9. The chassis according to claim 1 in which said chassis has front and rear faces respectively adjacent and parallel to opposite edges of said pair of end plates and one pair of said rails respectively being adjacent each of said faces and the rails of each pair respectively being adjacent the opposite edges of said faces, said rails also each having one side substantially parallel to the face of said chassis with which it is associated, and said sides of said pair of rails adjacent said front face each having flanges parallel to said face and extending toward each other and provided with notches therealong which are aligned with the ends of the grooves in said guide members adjacent said rails to serve as guide notches to facilitate positioning printed circuit boards in the corresponding grooves in opposed guide members.

10. The chassis according to claim 9 in which the sides of said rails opposite the sides from which said flanges project have additional notches therein in transverse alignment with the notches in said flanges and positioned to receive projections on the opposite ends of said guide members to align the grooves therein with said guide notches in said flanges.

11. A chassis for printed circuit boards or cards comprising in combination, a pair of end plates of rectilinear shape having openings in the corners thereof, similar extruded rails having channels extending longitudinally thereof, self-tapping screws extending through said openings in said end plates and threaded into the opposite ends of said channels and a plurality of said rails extending in parallelism between similar corners of said end plates to form a cage-like chassis having opposing front and rear faces in which pairs of said rails respectively are adjacent the opposite edges of said faces, parallel pairs of grooved guide members for circuit boards extending between pairs of said rails respectively adjacent the top and bottom of said chassis, the sides of the pairs of rails in said front face which are outermost relative to said face being parallel to said face and each rail having a flange thereon parallel to said front face and extending toward the opposite rail and said flanges respectively having similarly spaced rows of notches comprising guide notches for printed circuit boards, the sides of said rails opposite the flanged sides having one of said channels extending through said sides and the portion of said rails between one wall of said one of said channels and the side which extends away from said flange toward the opposite face of said chassis having notches extending therethrough in transverse alignment with said notches in said flange and comprising positioning notches receiving projections on the ends of said grooved guide members to dispose the ends of said grooves in said guide members in alignment with said guide notches in said flanges on said rails adjacent said front face.

12. The chassis according to claim 11 in which said grooved guide members are substantially H-shaped in cross-section, one side of said member having a guide groove extending longitudinally thereinto for slidably receiving one edge of a printed circuit board, the ends of the web between said opposite sides of said guide members being received respectively within said positioning notches in said opposite rails respectively adjacent said front and rear faces of said chassis to accurately locate said guide members in fixedly spaced parallel positions to receive the opposite edges of printed circuit boards therebetween.

13. The chassis according to claim 12 in which the opposite ends of said web are spaced a short distance inward from the ends of the grooved side of said guide members and respectively extend into said positioning notches in said rails, whereby the end portions of said grooved sides which extend beyond the ends of said web overlie the sides of said rails which extend between said flanges and the notched portion of said rails.

14. The chassis according to claim 13 in which tne ends of the other side of said guide members extend beyond the ends of said web but not as far as the ends of said grooved side and are received within said one of said channels in the side of said rail opposite that side which is outermost in said chassis in substantial coincidence with the front and rear faces of said chassis.

15. The chassis according to claim 14 in which only one end of said side of said H-shaped guide members opposite the grooved side thereof extends beyond the adjacent end of said web of said members, and said members each being provided on said one end thereof with a slide having a projection thereon extending toward said one end of said members and adapted to be extended into said one of said channels of said rails to secure said guide members in operative position between opposed rails respectively adjacent said front and rear faces of said chassis after the adjacent end of said web has been disposed within the positioning notch in the rail engaged by said projection on said slide.

16. The chassis according to claim 11 further including a locking slide substantially as long as said chassis and having a row of notches in one edge thereof spaced similarly to the guide notches in said flange in one of said rails, and guide means for said locking slide on the outermost side of one of said rails adjacent the front face of said chassis, said guide means being operable to dispose the row of notches in said locking slide adjacent and opposite the notches in said notched flange on said one of said rails, and said notches in said locking slide being out of registry with the notches in said flange when moved longitudinally of said guide means to prevent removal of boards from said chassis.

17. The chassis according to claim 16 in which said guide means comprise a plurality of slots spaced longitudinally in said slide and headed members on said one of said rails extending through said slots.

18. A chassis for printed circuit boards comprising a pair of parallel similar end plates of rectilinear shape having channelled rails extending between similar corners of said end plates, means connecting the ends of said rails to said end plates to form a cage-like chassis having parallel front and rear faces, pairs of parallel guide members respectively adjacent the top and bottom of said chassis and extending between the pairs of channelled rails respectively adjacent the top and bottom of said chassis to receive opposite edges of printed circuit boards between each said pair of guide members, at least one of said channelled rails adjacent said front face of said chassis having a channel opening outward toward said front face and said channel being wider at the inner end thereof in cross-section than the outer end thereof, in combination with a board insertion and removing tool comprising a handle bar having one short end extending angularly to said bar, and terminating in a head having a shape similar to the cross-section of one of said channels in said rail and slidable longitudinally along said channel, a flat link pivotally attached at one end to said bar intermediately of the ends thereof, and a short lug on one face of the opposite end of said link complementary to a hole formed in one edge of a printed circuit board adapted to be positioned adjacent the front face of said chassis, said lug being insertable in said hole in said board and the end of said handle bar opposite the end having the head thereon being movable manually toward or from said front face of said chassis respectively to move said board toward or from operative position in said chassis.

19. The chassis according to claim 18 in which said bar further includes a clevis movable frictionally and longitudinally along said bar, and said one end of said link being pivotally connected to said clevis for adjustable positioning of said link along said bar to minimize the possibility of cocking said boards incident to movement thereof by said tool.

20. The chassis according to claim 18 further including a flange on the edge of one of said end plates adjacent said front face of said chassis, and a spring clip attached to said flange and adapted to releasably engage said handle bar to maintain the same for convenient removal when use of the same is needed.

* * * * *